United States Patent
Yang et al.

(10) Patent No.: US 7,453,148 B2
(45) Date of Patent: Nov. 18, 2008

(54) STRUCTURE OF DIELECTRIC LAYERS IN BUILT-UP LAYERS OF WAFER LEVEL PACKAGE

(75) Inventors: Wen-Kun Yang, Hsin-Chu (TW); Chun-Hui Yu, Tainan (TW); Chao-Nan Chou, Taipei (TW); Chih-Wei Lin, Gueiren Township, Tainan County (TW); Ching-Shun Huang, Chigtong Township, Yunlin County (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 30 days.

(21) Appl. No.: 11/613,247

(22) Filed: Dec. 20, 2006

(65) Prior Publication Data

US 2008/0150130 A1    Jun. 26, 2008

(51) Int. Cl.
*H01L 23/48* (2006.01)
(52) U.S. Cl. ........................ 257/734; 257/737
(58) Field of Classification Search ............... 257/734, 257/778, 737
See application file for complete search history.

(56) References Cited

U.S. PATENT DOCUMENTS 6,004,867 A * 12/1999 Kim et al. ................... 438/459
7,218,003 B2 * 5/2007 Storli ........................ 257/737

* cited by examiner

*Primary Examiner*—Roy K Potter
(74) *Attorney, Agent, or Firm*—Kusner & Jaffe

(57) ABSTRACT

The present invention provides a structure of elastic dielectric layers with certain through holes adjacent to the angle of a RDL of WLP to absorb the stress. The elastic dielectric layer is made from silicone based materials with specific range of CTE, elongation rate and hardness, which can improve the mechanical reliability of the structure during temperature cycling test. The CTE difference between the RDL and the elastic dielectric material still may cause the elastic dielectric layer crack; to solve this problem, The present invention further provides a structure of dielectric layers with certain open through holes adjacent to the curve portion of a RDL of WLP which can reduce the stress accumulated at area of the dielectric layer adjacent to the RDL/dielectric layer interface to solve the crack problem of the dielectric layer.

18 Claims, 4 Drawing Sheets

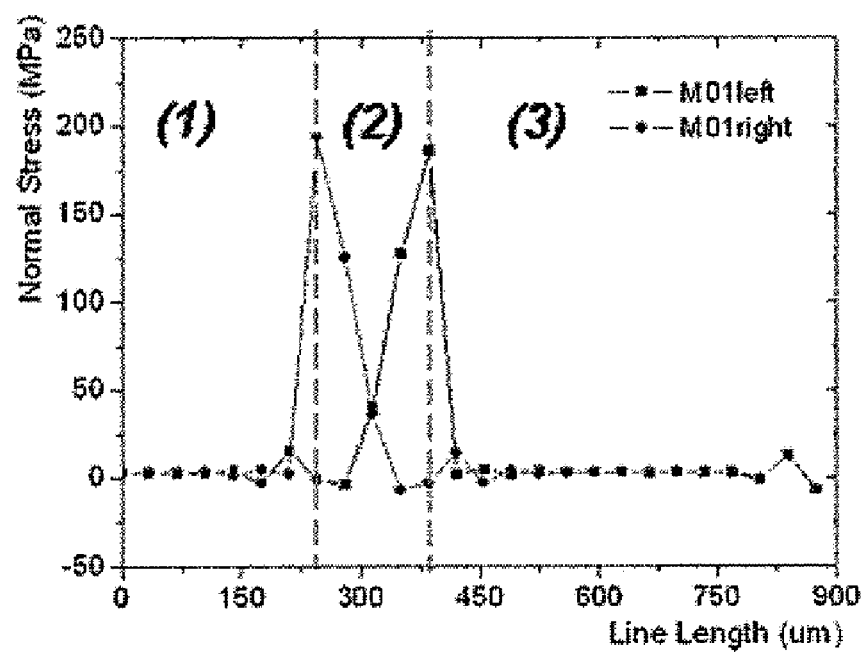
FIGURE 3 (RDL(Cu))
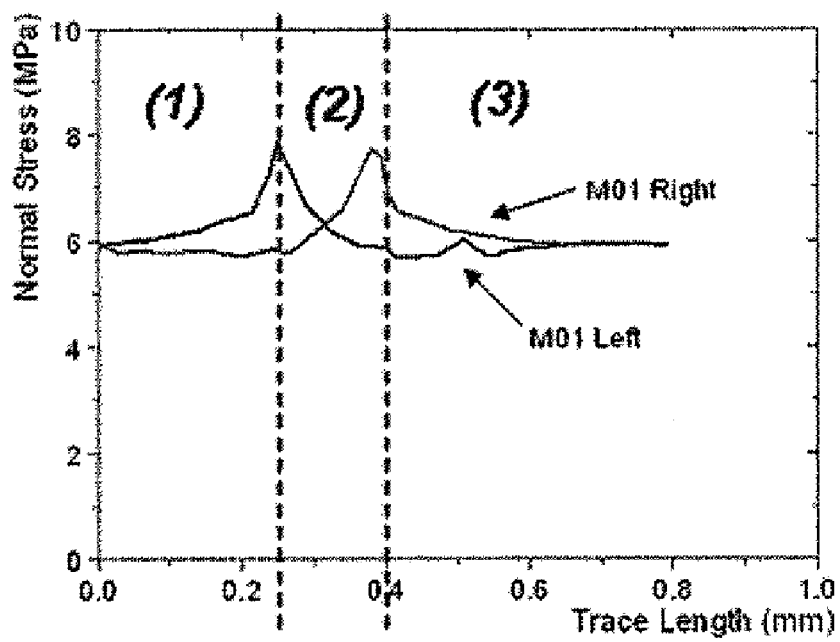
FIGURE 4 (dielectric layer)

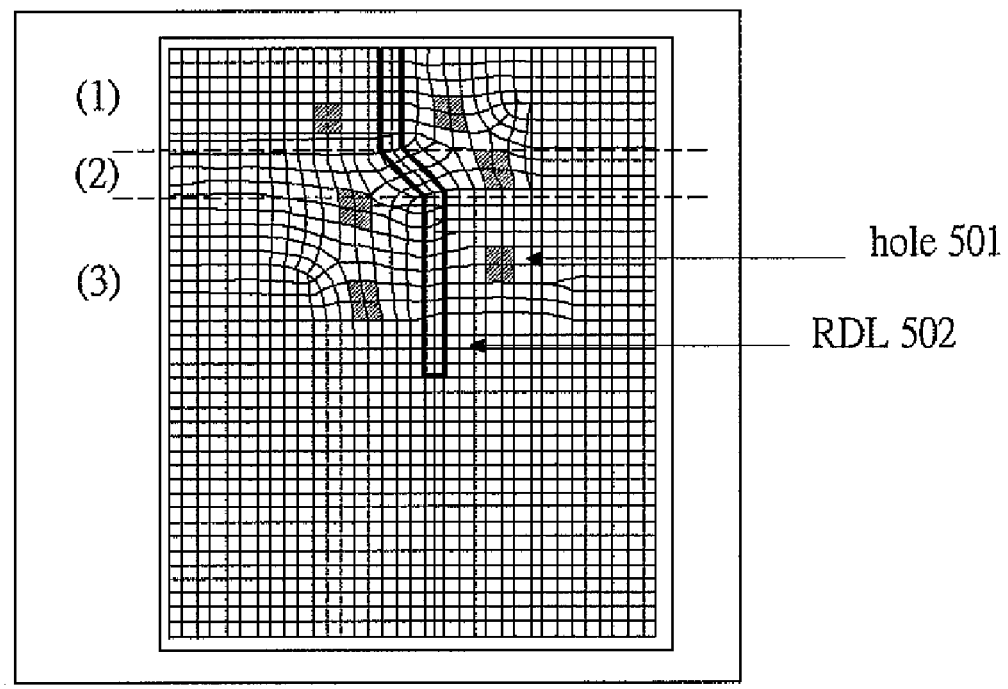
FIGURE 5
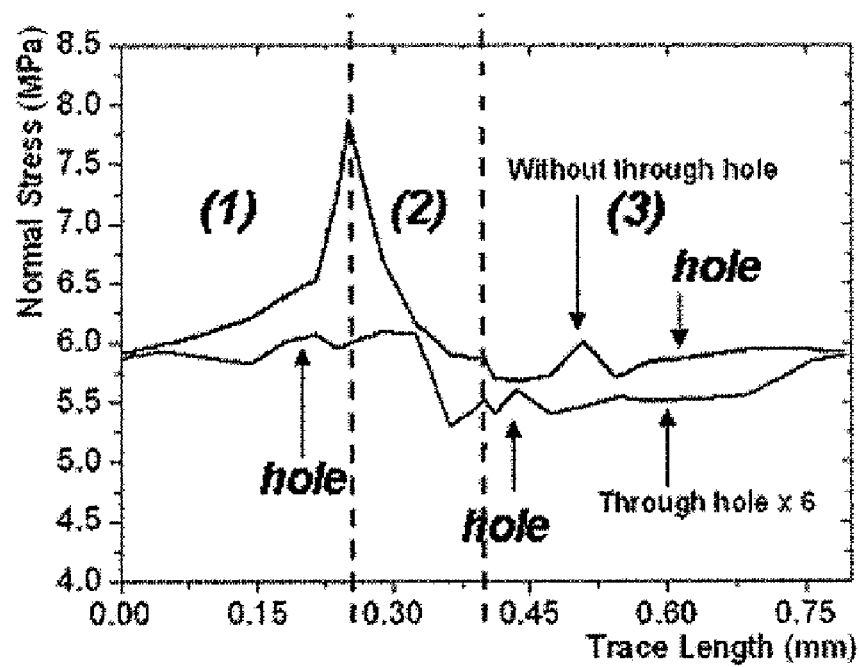
FIGURE 6 (left side)

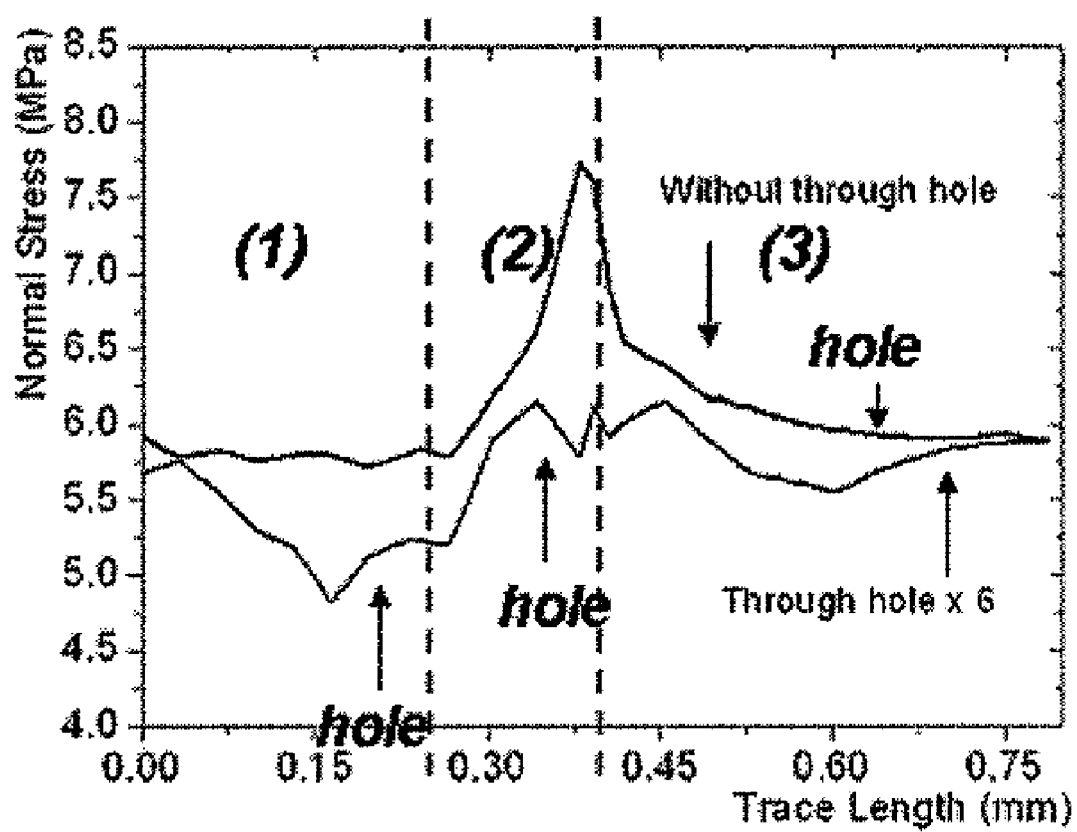
FIGURE 7 (right side)

STRUCTURE OF DIELECTRIC LAYERS IN BUILT-UP LAYERS OF WAFER LEVEL PACKAGE

FIELD OF THE INVENTION

This invention relates to a structure of wafer level package (WLP), and more particularly to a structure of dielectric layers with certain open through holes thereon of WLP.

DESCRIPTION OF THE PRIOR ART

For mobile appliances, e.g., cellular phones, notebooks, and the like, or applications where physical space for devices is extremely valuable, e.g., aircraft and the like, size is a critical factor to a successful design of the device, but the demand of reducing the size of a chip conflict with the trend of increasing elements on said chip.

The function of chip package includes power distribution, signal distribution, heat dissipation, protection and support . . . and so on. As a semiconductor become more complicated, the traditional package technique, e.g., lead frame package, flex package, rigid package technique, can't meet the demand of producing smaller chip with high density elements on the chip. Furthermore, because conventional package technologies have to divide a dice on a wafer into respective dies and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip (FC-BGA), chip scale package (CSP), Wafer level package (WLP) today.

WLP technique is an advanced packaging technology, by which the die are manufactured and tested on the wafer, and then singulated by dicing for assembly in a surface-mount line. Because the wafer level package technique utilizes the whole wafer as one object, not utilizing a single chip or die, hence, before performing a scribing process, packaging and testing has been accomplished; furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices.

The die utilizing WLP technique is also characterized by wider pitch and larger ball structures than associated structures made from other package techniques; wherein larger diameter balls support the mechanical requirement to reduce the coefficient of thermal expansion (CTE) mismatch strain between the IC and the interconnecting substrate.

Though the advantages of WLP technique mentioned above make WLP the eye-catching package technique in this technical field, some issues still exist influencing the acceptance of WLP technique. For example, although utilizing WLP technique can reduce the CTE mismatch between IC and the interconnecting substrate, as the size of the device minimizes, the CTE difference between the materials of a structure of WLP, e.g., dielectric layers and re-distribution layers (RDLs), become another critical factor to mechanical instability of said structure, e.g., the cracking problem of dielectric layers, during the packaging process.

FIG. 1 illustrates a WLP structure comprising dielectric layers, in which RDLs are built. The material of said dielectric layer comprises silicone based material, for example, siloxane polymer (SINR), BCB, PI, and said RDL metal, e.g., Cu, is covered by the dielectric layers except the openings opened for conductive terminals.

Comparing with the CTE of a RDL metal, for example Cu (about 17), the typical CTE of an elastic dielectric material is larger than 100; therefore, the CTE difference would causes substantial mismatch between the RDL and the dielectric layer during the temperature cycling test. FIG. 3 illustrates the RDL/dielectric layer subjected to peeling force in Y axial direction to gather the data of the stress state. FIG. 4 and FIG. 5 illustrate the stress value on the RDL/dielectric layer sampling along the Y axial. Referring to FIG. 4 and FIG. 5, at the area adjacent to the left side of M01, the stress value on the RDL, and the dielectric layer rises to maximum at the line between section 1 and section 2, and then drops sharply; Similarly, at the area adjacent to the right side of M01, the stress value on the RDL and the dielectric layer rises to its maximum at the line between the section 2 and the section 3 and then drops. According to the stress analysis, we can find that, at the area adjacent to the curve of the RDL, the accumulating stress rises to its maximum; this phenomenon is cause by Package rigidity. The package rigidity comes from poor thermal stress relaxation, e.g., the CTE mismatch mentioned above, which causes the dielectric layer deforms, and then the stress accumulated in the RDL/Dielectric layer interface may cause the dielectric layer crack at un-balanced area, for example, as show in the FIG. 1, the area on dielectric layer adjacent to the curve of the RDL.

Therefore, the present invention provides a structure of dielectric layers with certain open through holes thereon of WLP to overcome the crack problem of dielectric layers near a curve of a RDL.

SUMMARY OF THE INVENTION

The present invention provides a structure of elastic dielectric layers with certain open through holes of WLP to absorb the stress. The CTE difference between a RDL and a dielectric layer may cause the dielectric layer crack. To solve this problem, the present invention utilizes elastic dielectric layers; wherein the material of the elastic dielectric layer comprises silicone based material, for example, SINR, PCB, PI, with specific range of CTE, elongation rate and hardness. The elastic dielectric layer can improve the mechanical reliability of the structure of WLP during temperature cycling test. The present invention further provides a structure of dielectric layers with certain open through holes adjacent to the curve of a RDL of a WLP which can reduce the stress accumulated at area of the dielectric layer adjacent to the RDL/dielectric layer interface and then solve the crack problem of the dielectric layer.

BRIEF DESCRIPTION OF THE DRAWINGS

FIG. 3 illustrates the stress value on the RDL (Cu) sampling along the Y axial.

FIG. 4 illustrates the stress value on the dielectric layer sampling along the Y axial.

FIG. 5 illustrates a structure of the dielectric layer with six open through rectangular holes formed on the adjacent to the curve of the RDL of WLP.

FIG. 6 illustrates the stress value on left side of the dielectric layer sampling along the Y axial before and after the open through holes are formed.

FIG. 7 illustrates the stress value on right side of the dielectric layer sampling along the Y axial before and after the open through holes are formed.

DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustrating. Besides the preferred embodiment mentioned here, present invention can be practiced in a wide range of other embodiments besides those explicitly described, and the scope of the present invention is expressly not limited expect as specified in the accompanying claims.

The present invention discloses a structure of WLP utilizing elastic dielectric layers to improve the mechanical reliability, e.g., absorb the accumulated stress due to CTE mismatching of materials, of the structure of WLP during temperature cycling test. The present invention discloses a structure of the dielectric layer with certain open through holes formed near the curve of the RDL of WLP, by which the stress can be further reduced.

Figure 1:
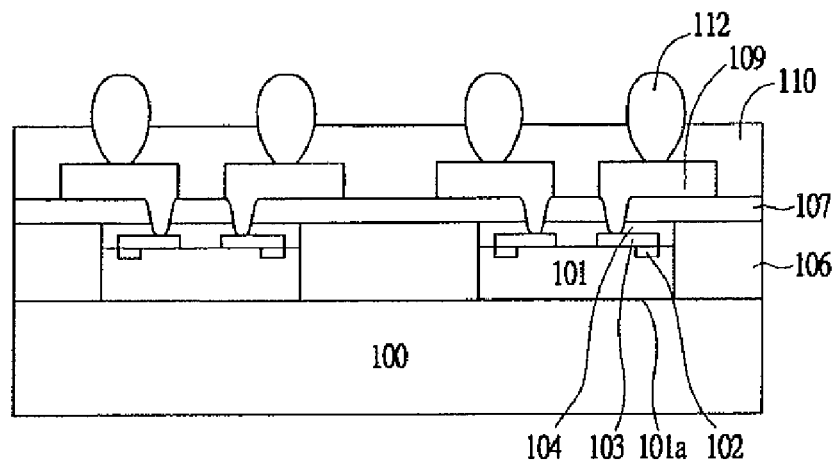
FIG. 1 illustrates a cross-sectional view of a structure of dielectric layers in built-up layers of WLP.

FIG. 1 illustrates a cross-sectional view of a structure of the dielectric layers in built-up layers of WLP in accordance with one embodiment of the present invention.

As shown in the FIG. 1, the structure of WLP includes the die 101 disposed on the substrate 100 and fixed by adhesion 101a. The RDL 103, also referred to as metal trace, is formed on the die 101 by removing selected portions of the RDL by photolithography; wherein the RDL 103 keeps electrically connected with the chip 101 through the I/O pads 102.

The structure of WLP of the present invention also comprises dielectric layers. The first dielectric layer 104 is formed atop of the die 101 and defined by the peripheral edge of the die 101. The second dielectric layer 106 is formed atop of the substrate 100 and fills the space surrounding the die 101 and the first dielectric layer 104, and then third dielectric layer 107 is formed on the second dielectric layer 106 and the first dielectric layer 104.

By removing selected portions, e.g., by photolithography, of the first dielectric layer 104 and the third dielectric layer 107, a plurality of openings are formed on the first dielectric layer 104 and on the third dielectric layer 107, and then the redistribution layer 109 is formed, e.g., by deposition, in the openings, on the first dielectric layer 104 and on the third dielectric layer 107; wherein the RDL 109 can keeps electrically contact with the RDL 103. After the RDL 109 is formed, the dielectric layer 110 is formed atop of the RDL 109. Next, a plurality of openings formed thereon by removing, e.g., by photolithography, selected portions of the dielectric layer 110. The openings formed on the dielectric layer 110 can be divided to two groups; a group of openings (hole1) is formed on the RDL 109, the other group of openings (hole2) is formed near the curve of the RDL 109. Next, the contact metal balls (solder ball) 112 are formed on hole 1 to electrically couple with the RDL 109 and a print circuit board or external parts (UBM structure does not show in the drawing).

In one embodiment of the present invention, the dielectric layer is preferably an elastic dielectric material which is made by silicone based material comprising SINR, silicon oxide, silicone nitride, and composites thereof. In another embodiment, the dielectric layer is made by a material comprising benzocyclobutene (BCB), epoxy, polyimides (PI) or resin.

In one embodiment of the present invention, the main characters of the elastic dielectric layer are CTE higher than 100 (ppm/° C.) (preferably around 130 to 170 ppm/° C.), the elongation rate about 40 percent (preferably 30 percent to 50 percent), the hardness between plastic and rubber and the deformation ratio between 20 percent and 60 percent. The thickness of the elastic dielectric layer 110 depends on the stress accumulated in the RDL/dielectric layer interface during temperature cycling test, preferably is from 10 μm to 50 μm.

In one embodiment of the invention, the material of the RDL 103 and the RDL 109 comprises Ti/Cu/Au alloy or Ti/Cu/Ni/Au alloy.

The thickness of the RDL 103 is preferably between 2 and 10 microns and the main characters of RDL 103 are CTE of the RDL 103 around 17 (ppm/° C.) (preferably around 14 to 20 ppm/° C.), and the elongation rate about 20 percent (preferably 10 percent to 40 percent), and the deformation ratio of between 10 and 20 percent. As to the RDL 109, the thickness of the RDL 109 is preferably between 5 μm and 20 μm microns and the other main characters are CTE of the RDL 109 around 17 (ppm/° C.)(preferably around 14 to 20 ppm/° C.), the elongation rate about 20 percent (preferably 10 percent to 40 percent), and the deformation ratio between 10 and 20 percent.

The Ti/Cu alloy is formed by sputtering technique, and the Cu/Au or CU/Ni/Au alloy is formed by electroplating; exploiting the electro-plating process to form the RDL 103 and the RDL 109 can make the RDL thick enough to withstand CTE mismatching during temperature cycling. The metal pads 102 can be Al or Cu or combination thereof.

In one embodiment of the present invention, the structure of WLP is utilized SINR as the elastic dielectric layer and Cu as the RDL. According the stress analysis not shown here, the stress accumulated in the RDL/dielectric layer interface is reduced.

Figure 2:
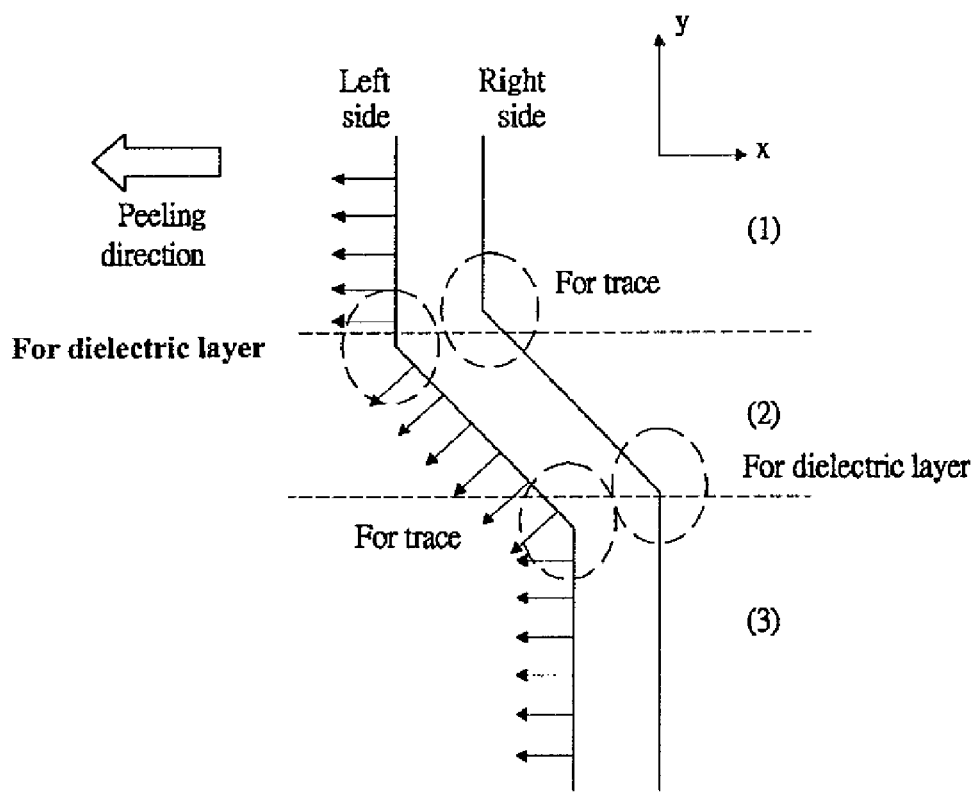
FIG. 2 illustrates the RDL/dielectric layer subjected to peeling force in Y axial direction.

FIG. 2 shows a RDL/dielectric layer subjected to peeling force in Y axial direction to obtain the value of the stress state of a dielectric layer. As shown in the FIG. 2, the RDL/dielectric layer is divided to 3 sections according to the curve point of the RDL; and the dotted line between the sections is parallel to the x axial. FIG. 3 and FIG. 4 shows the stress values sampling along the Y axial direction across the sections; wherein FIG. 3 shows the stress value on the RDL (Cu) sampling along the Y axial, and FIG. 4 shows the stress value on the dielectric layer sampling along the Y axial. As shown in FIG. 3, at the area adjacent to the right side of M01, the stress value on RDL rises sharply and reaches its maximum (about 200 MPa) at the line between section 1 and section 2, and then drops sharply; similarly, at the area adjacent to the left side of M01, the stress value on the RDL rises to its maximum at the line between section 2 and section 3 and then drops sharply; Referring to FIG. 4, the stress value on the dielectric layer shows the similar trend of the stress value on RDL (Cu) in FIG. 3. As shown in FIG. 4, at the area adjacent to the left side of M01, the stress value on the dielectric layer rises to its maximum at the line between section 1 and section 2, and then drops. Similarly, at the area near the right side of M01, the stress value on the dielectric layer rises to its maximum at the line between section 2 and section 3 and then drops.

According to the stress analysis mentioned above, referring to FIG. 3 and FIG. 4, even utilizing elastic dielectric layers, we can find that the stress still accumulated at the areas near the curve of the RDL (Cu) which enhance the chance of crack of the elastic dielectric layer. To solve this problem, as shown in FIG. 5, in one embodiment of the present invention, certain open through holes 601 are formed on the dielectric layer to absorb the stress.

The location of the open-through holes (add reference number) of the dielectric layer is critical to reduce the RDL/ dielectric layer interface during temperature cycling test. According to one embodiment of the present invention, the open through holes is formed on the dielectric layer adjacent to the curve portion of the RDL; in another embodiment of the present invention the holes are formed by litho photograph process. In another embodiment of the present invention, the shape of the open through hole comprises triangle, square, rectangle and circle; preferably the shape of the open through hole is rectangle with curve edges form in four end corner. In another embodiment of the present invention, the distance of the open through hole near and along the curve portion of the RDL is between 5 and 100 um; preferably around 5 to 20 um or located in the middle of trace if the space between two adjacent RDLs is less than 20 um. In another embodiment of the present invention, the number of the open through holes depend on the hole size; generally, the number of the holes are between 2 and 12. More specifically, the preferred size of the open through hole is between 5 um×10 um and 10 um×20 um and the number of the open through holes are between 4 and 6.

The FIG. 5 illustrate one embodiment of a WLP structure constructed according to the present invention, six open through rectangular holes 501 are formed on the dielectric layer adjacent to the curve portion of a RDL 502 of the structure of WLP; wherein three of the holes 501 are formed on the left side of the RDL 502, three are formed on the right side; wherein the area of the hole 501 is between 50 μm² to 200 μm² and the angle of the curve portion of the RDL 502 is 45 degree. FIG. 6 and FIG. 7 shows the stress value on dielectric layer sampling along the Y axial before and after the open through holes are formed; wherein the upper line represents the stress value on the dielectric layer without the holes formed near the curves of the RDL 502 and the below one represents the stress value on dielectric layer with six holes formed adjacent to the curves of the RDL 502. As shown in the FIG. 6, without the holes 501 formed on the dielectric layer, the stress value on left side rises sharply and reaches maximum at the line between section 1 and section 2, and then drops sharply; after the holes 501 formed, the peak of stress value at the line between section 1 and section 2 dropped obviously; at other sections, the stress value shows similar trend. FIG. 7 illustrates the stress value on right side of the dielectric layer sampling along the Y axial; we can find the similar trend of stress value as shown in FIG. 7. In another embodiment of the invention not shown here, the mechanical stress on the dielectric layer adjacent to the curve portion of the RDL reduced from 5 percent to 40 percent comparing the stress value before the hole are formed.

Another embodiment of the present invention not shown here is a structure of elastic dielectric layers in built-up layers of a fan-out WLP. According to stress analysis not shown here, after the open through holes are formed on the elastic dielectric layer adjacent to the curve portion of a RDL, the stress value on dielectric layer adjacent to the curve portion of a RDL drops significantly too.

Another embodiment of the present invention not shown here is a structure of elastic dielectric layers in built-up layers of pure silicon wafer level package (fan-in type WL-CSP). According to stress analysis not shown here, after the open through holes are formed on the elastic dielectric layer adjacent to the curve portion of a RDL, the stress value on the dielectric layer adjacent to the curve portion of a RDL drops significantly too.

Although preferred embodiments of the present invention have been described, it will be understood by those skilled in the art that the present invention should not be limited to the described preferred embodiments. Rather, various changes and modifications can be made within the spirit and scope of the present invention, as defined by the following claims.

Having described the invention, the following is claimed:

1. A structure of a wafer level package, comprising:
   a die;
   at least one dielectric layer with certain open through holes formed thereon;
   a re-distribution layer (RDL) with a curve portion configured with said at least one dielectric layer and coupled to said die, wherein said open through holes are formed adjacent to said curve portion of said RDL on a surface of said dielectric layer and therefore the stress accumulated at said dielectric layer near an interface between said RDL and said dielectric layer is reduced by said curve portion and said open though holes;
   an I/O pad which keep electrical contact between said die and said RDL; and
   contact balls formed to electrically couple with said RDL and print circuit board or external parts.

2. The structure of claim 1, wherein said dielectric layer is an elastic dielectric layer.

3. The structure of claim 2, wherein the thickness of said elastic dielectric layers is between 10 μm and 50 μm.

4. The structure of claim 2, wherein said elastic dielectric material comprises a silicone based material, BCB, and PI.

5. The structure of claim 4, wherein said silicone based material comprises siloxane polymers (SINR), silicon oxide, silicon nitride, and composites thereof.

6. The structure of claim 2, wherein the coefficient of thermal expansion (CTE) of said elastic dielectric layer is higher than 100 (ppm/° C).

7. The structure of claim 2, wherein the elongation rate of said elastic dielectric layer is between 30 percent and 50 percent.

8. The structure of claim 2, wherein the deformation ratio of said elastic dielectric layer is between 20 percent and 60 percent.

9. The structure of claim 1, wherein the thickness of said RDL is between 2 micron and 20 micron.

10. The structure of claim 1, wherein said RDL is made from an alloy comprising Ti/Cu/Au alloy or Ti/Cu/Ni/Au alloy.

11. The structure of claim 1, wherein the CTE of said RDL is around 17 (ppm/° C.).

12. The structure of claim 1, wherein the CTE of said RDL is between 14 and 20 (ppm/° C.).

13. The structure of claim 1, wherein the elongation rate of said RDL is between 10 percent and 40 percent.

14. The structure of claim 1, wherein the deformation ratio of said RDL is between 10 percent and 20 percent.

15. The structure of claim 1, wherein the area of said at least one open through hole is between 50 μm² and 200 μm².

16. The structure of claim 1, wherein the shape of said at least one open through hole comprises circle, triangle, square, rectangular.

17. The structure of claim 1, wherein said at least one open though hole is formed at the positions which can reduce the mechanical stress on said at least one dielectric layer adjacent to said curve portion of said RDL from 5 percent to 40 percent comparing the stress value before said hole are formed.

18. The structure of claim 1, wherein said die disposed on a substrate.

* * * * *